United States Patent
Lin et al.

(10) Patent No.: US 6,859,378 B1
(45) Date of Patent: Feb. 22, 2005

(54) MULTIPLE MATCH DETECTION LOGIC AND GATES FOR CONTENT ADDRESSABLE MEMORY (CAM) DEVICES

(75) Inventors: James K. Lin, Cupertino, CA (US); Chau-Chin Wu, Cupertino, CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 10/869,387

(22) Filed: Jun. 16, 2004

Related U.S. Application Data

(62) Division of application No. 10/385,155, filed on Mar. 10, 2003, now abandoned.

(51) Int. Cl.$^7$ .............................................. G11C 15/00
(52) U.S. Cl. .................................... 365/49; 365/189.11
(58) Field of Search ............................... 365/49, 189.11

(56) References Cited

U.S. PATENT DOCUMENTS

| | | | |
|---|---|---|---|
| 5,748,070 A | 5/1998 | Priebe et al. | |
| 5,852,569 A | 12/1998 | Srinivasan et al. | |
| 6,044,005 A | 3/2000 | Gibson et al. | |
| 6,137,707 A | 10/2000 | Srnivasan et al. | |
| 6,175,513 B1 | 1/2001 | Khanna | |
| 6,175,514 B1 | 1/2001 | Henderson et al. | |
| 6,195,277 B1 | 2/2001 | Sywyk et al. | |
| 6,243,281 B1 | 6/2001 | Pereira | |
| 6,301,636 B1 | 10/2001 | Schultz et al. | |
| 6,307,798 B1 | 10/2001 | Ahmed et al. | |
| 6,317,350 B1 | 11/2001 | Pereira et al. | |
| 6,362,993 B1 * | 3/2002 | Henderson et al. | 365/49 |
| 6,392,910 B1 | 5/2002 | Podaima et al. | |
| 6,480,406 B1 * | 11/2002 | Jin et al. | 365/49 |
| 6,490,650 B1 | 12/2002 | Pereira | |
| 6,493,793 B1 | 12/2002 | Pereira et al. | |
| 6,499,081 B1 | 12/2002 | Nataraj et al. | |
| 6,687,785 B1 | 2/2004 | Pereira | |
| 6,697,912 B2 | 2/2004 | Akkary | |
| 6,707,694 B2 | 3/2004 | Regev | |
| 6,717,876 B2 | 4/2004 | Vlasenko et al. | |
| 6,718,433 B1 | 4/2004 | Pereira | |
| 6,728,124 B1 | 4/2004 | Ichiriu et al. | |
| 2003/0005146 A1 | 1/2003 | Miller et al. | |
| 2003/0145178 A1 | 7/2003 | Jiang | |
| 2004/0015652 A1 | 1/2004 | Park et al. | |

OTHER PUBLICATIONS

Miller et al., "Content Addressable Memory Array Having Flexible Priority Support," U.S. Appl. No. 09/884,797, filed Jun. 18, 2001.

* cited by examiner

*Primary Examiner*—Richard Elms
*Assistant Examiner*—Tuan T. Nguyen
(74) *Attorney, Agent, or Firm*—Myers Bigel Sibley & Sajovec

(57) ABSTRACT

Content addressable memory (CAM) devices according to embodiments of the present invention include high performance multiple match detection circuits therein. These match detection circuits use 2-to-1 multiple match gates that are small, consume no static power and are hierarchically cascadable. The match detection circuits are also configured so that match signal inputs see small fanouts and high speed operation can be achieved. At each intermediate and final stage of the match detection circuit, the multiple match gates process two pairs of inputs into a single pair of outputs. In particular, a match detection circuit is configured to generate a final multiple match flag (MMF) and a final any match flag (AMF) in response to input match signals, with the match detection circuit including $\log_2 N$ stages of 2-to-1 multiple match gates, where $N=2^k$ and k is a positive integer. The final MMF is set to an active level whenever at least two of the input match signals indicate a match condition and the AMF is set to an active level whenever at least one of the input match signals indicates a match condition.

4 Claims, 9 Drawing Sheets

MULTIPLE MATCH DETECTION LOGIC AND GATES FOR CONTENT ADDRESSABLE MEMORY (CAM) DEVICES

REFERENCE TO PRIORITY APPLICATION

This application is a divisional of U.S. application Ser. No. 10/385,155, filed Mar. 10, 2003, now abandoned the disclosure of which is hereby incorporated herein by reference.

FIELD OF THE INVENTION

The present invention relates to integrated circuit memory devices and, more particularly, to content addressable memory (CAM) devices.

BACKGROUND OF THE INVENTION

In many memory devices, including random access memory (RAM) devices, data is typically accessed by supplying an address to an array of memory cells and then reading data from the memory cells that reside at the supplied address. However, in content addressable memory (CAM), devices, data within a CAM array is typically not accessed by supplying an address, but rather by applying data (e.g., search words) to the array and then performing a search operation to identify one or more entries within the CAM array that contain data equivalent to the applied data and thereby represent a "match" condition. In this manner, data is typically accessed according to its content rather than its address. Upon completion of the search operation, the identified location(s) containing the equivalent data is typically encoded to provide an address (e.g., block address+row address within a block) at which the matching entry is located. If multiple matching entries are identified in response to the search operation, then local priority encoding operations may be performed to identify a location of a best or highest priority matching entry. Such priority encoding operations frequently utilize the relative physical locations of multiple matching entries within the CAM array to identify a highest priority matching entry. An exemplary CAM device that utilizes a priority encoder to identify a highest priority matching entry is disclosed in commonly assigned U.S. Pat. No. 6,370,613 to Diede et al., entitled "Content Addressable Memory with Longest Match Detect," the disclosure of which is hereby incorporated herein by reference. Additional CAM devices are described in U.S. Pat. Nos. 5,706,224, 5,852,569 and 5,964,857 to Srinivasan et al. and in U.S. Pat. Nos. 6,101,116, 6,256,216, 6,128,207 and 6,262,907 to Lien et al., assigned to the present assignee, the disclosures of which are hereby incorporated herein by reference.

CAM cells are frequently configured as binary CAM cells that store only data bits (as "1" or "0" logic values) or as ternary CAM cells that store data bits and mask bits. As will be understood by those skilled in the art, when a mask bit within a ternary CAM cell is inactive (e.g., set to a logic 1 value), the ternary CAM cell may operate as a conventional binary CAM cell storing an "unmasked" data bit. When the mask bit is active (e.g., set to a logic 0 value), the ternary CAM cell is treated as storing a "don't care" (X) value, which means that all compare operations performed on the actively masked ternary CAM cell will result in a cell match condition. Thus, if a logic 0 data bit is applied to a ternary CAM cell storing an active mask bit and a logic 1 data bit, the compare operation will indicate a cell match condition. A cell match condition will also be indicated if a logic 1 data bit is applied to a ternary CAM cell storing an active mask bit and a logic 0 data bit. Accordingly, if a data word of length N, where N is an integer, is applied to a ternary CAM array having a plurality of entries therein of logical width N, then a compare operation will yield one or more match conditions whenever all the unmasked data bits of an entry in the ternary CAM array are identical to the corresponding data bits of the applied search word. This means that if the applied search word equals (1011), the following entries will result in a match condition in a CAM comprising ternary CAM cells: {1011}, {X011}, {1X11}, {10X1}, {101X}, {XX11}, {1XX1}, . . . , {1XXX}, {XXXX}.

CAM devices may also include multiple match detection circuits that generate a flag to indicate the presence of multiple matching entries when a search operation is performed within a CAM device. For example, FIG. 3 of U.S. Pat. No. 6,175,513 to Khanna illustrates a multiple match detection circuit 10 that uses logic 15 to generate a plurality of intermediate multiple match flags (MM1–MM3). A final multiple match flag (MMF) is generated by logically combining the intermediate multiple match flags using an OR gate. The speed and scalability of the multiple match detection circuits disclosed in the '513 patent may be limited by the fact that each match signal input sees a relatively large fanout. For example, as illustrated by FIGS. 5 and 6A–6E of the '513 patent, a fanout of n (e.g., 5) will be required in a multiple match detection circuit that receives $2^n$ (e.g., 32) match signal inputs. U.S. Pat. Nos. 5,748,070, 5,852,569, 6,195,277, 6,307,798 and 6,392,910 also disclose multiple match detection circuits that may be used in CAM devices. Notwithstanding these CAM devices, there continues to be a need for CAM devices having higher performance multiple match detection circuits therein.

SUMMARY OF THE INVENTION

Content addressable memory (CAM) devices according to embodiments of the present invention include high performance multiple match detection circuits therein. These match detection circuits use 2-to-1 multiple match gates that have small transistor count, consume no static power, and are hierarchically cascadable. The multiple match detection circuits are also configured so that match signal inputs see small fanouts and high speed operation can be achieved. At each intermediate and final stage of the multiple match detection circuit, the multiple match gates process two pairs of input signals into a single pair of output signals. In particular, a multiple match detection circuit is configured to generate a final multiple match flag (MMF) and a final any match flag (AMF) in response to N input match signals, with the multiple match detection circuit including $\log_2 N$ stages of 2-to-1 multiple match gates, where $N=2^k$ and k is a positive integer. The final MMF is set to an active level whenever at least two of the input match signals indicate a match condition and the AMF is set to an active level whenever at least one of the input match signals indicates a match condition.

According to additional embodiments of the invention, a multiple match detection circuit comprises $\log_2 N-1$ stages of 2-to-1 multiple match gates that are each configured to generate a respective pair of any match and multiple match flags in response to two intermediate pairs of any match and multiple match flags. This multiple match detection circuit may also include a first stage having ½N multiple match gates therein that are configured to receive the N input match signals. In particular, each of the multiple match gates in the first stage generates a respective pair of any match and multiple match flags, in response to a pair of match signals.

In still further embodiments of the present invention, the multiple match detection circuit may include a total of N−1 multiple match gates that are arranged in a cascaded fashion, with a first stage having ½N gates therein, a final stage having one gate therein and a plurality of intermediate stages having a total of ½N-2 gates therein. The multiple match gates in the final and intermediate stages may be configured with only twelve (12) transistors per gate and the multiple match gates in the first stage may be configured with only eight (8) transistors per gate. Thus, a multiple match detection circuit that processes 1024 match signals may be configured to use 10,228 transistors, where 10,228=((½N× 8)+((½N−1)×12)).

DESCRIPTION OF PREFERRED EMBODIMENTS

Figure 3:
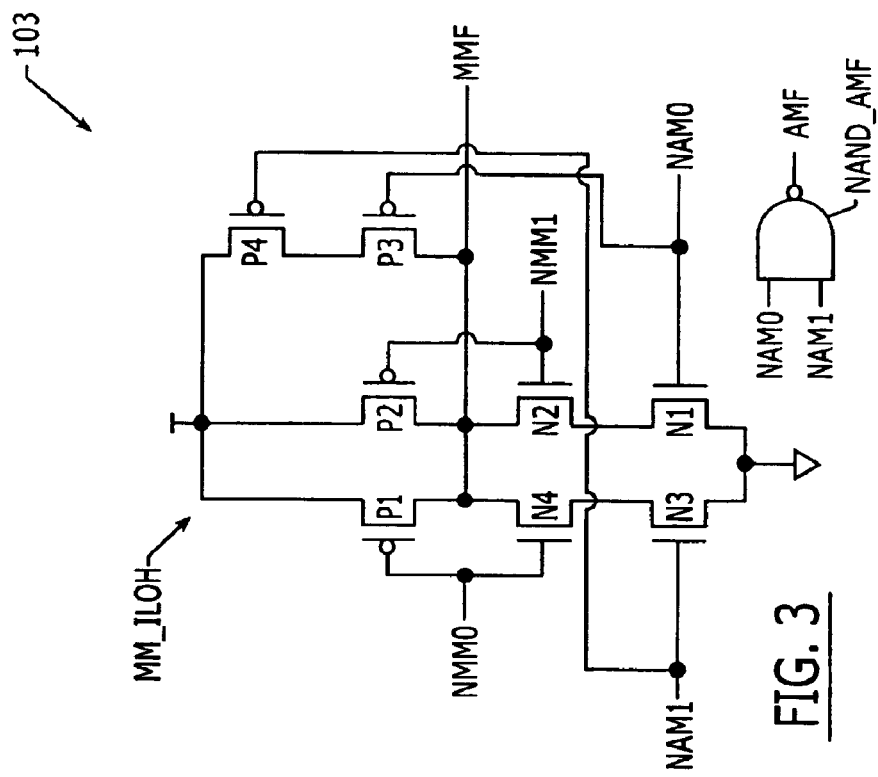
FIGS. 1–4 are electrical schematics of 2-to-1 multiple match gates according to embodiments of the present invention.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals. The suffix B (or prefix symbol "/" or prefix letter "N") to a signal name may indicate that the signal is an active low data, information or control signal, for example.

Figure 1:
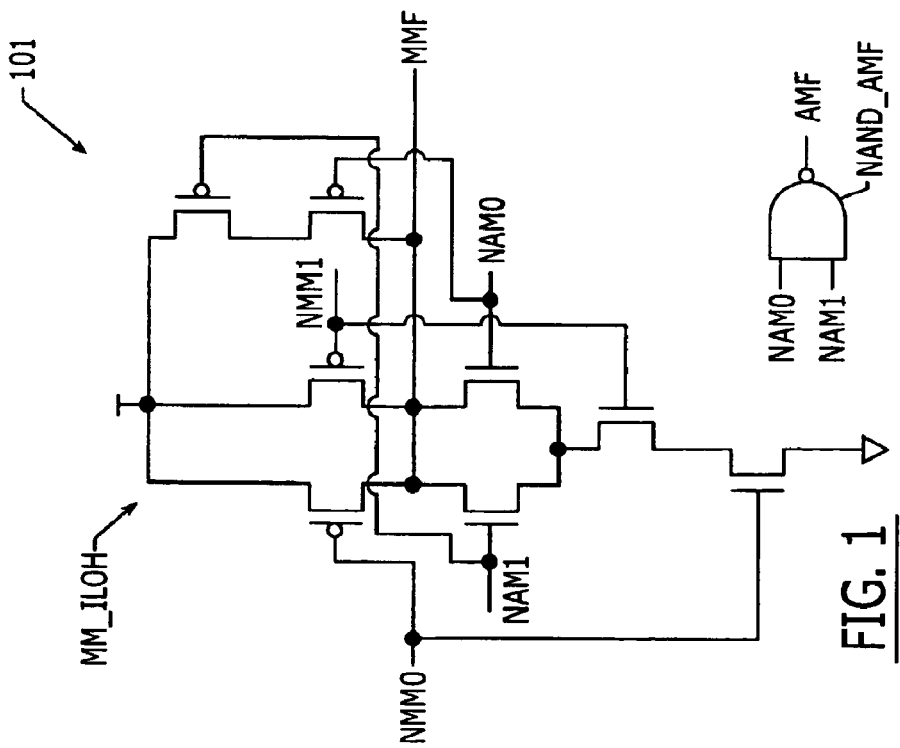

Referring now to FIG. 1, a 2-to-1 multiple match gate 101 according to a first embodiment of the present invention generates active high output signals in response to active low input signals. As illustrated, the multiple match gate 101 receives four active low input signals, which are shown as NAM0 ("not any match zero"), NAM1 ("not any match one"), NMM0 ("not multiple match zero") and NMM1 ("not multiple match one"). In response to these four active low input signals, the multiple match gate 101 generates an active high "any match flag" (AMF) and an active high "multiple match flag" (MMF). The AMF is generated by a NAND gate, which is shown as NAND_AMF. Thus, the AMF will be generated as an active high signal whenever either signal NAM0 or NAM1 is active at a low level or both signals are active at low levels. As will be understood by those skilled in the art, the NAND gate NAND_AMF may be defined by four transistors. In FIG. 1, the MMF is generated by a multiple match circuit having four PMOS transistors and four NMOS transistors. The multiple match circuit is illustrated as an "input-low output-high" multiple match circuit (MM_ILOH). The four transistors within the NAND gate NAND_AMF and the eight transistors within the multiple match circuit MM_ILOH operate in accordance with the truth table illustrated by TABLE 1.

TABLE 1

| NAM0 | NMM0 | NAM1 | NMM1 | AMF | MMF | DESCRIPTION |
|---|---|---|---|---|---|---|
| 0 | 0 | 0 | 0 | 1 | 1 | Multiple Match |
| 0 | 0 | 0 | 1 | 1 | 1 | Multiple Match |
| 0 | 0 | 1 | 0 | X | X | Invalid Combination |
| 0 | 0 | 1 | 1 | 1 | 1 | Multiple Match |
| 0 | 1 | 0 | 0 | 1 | 1 | Multiple Match |
| 0 | 1 | 0 | 1 | 1 | 1 | Multiple Match |
| 0 | 1 | 1 | 0 | X | X | Invalid Combination |
| 0 | 1 | 1 | 1 | 1 | 0 | Single Match |
| 1 | 0 | 0 | 0 | X | X | Invalid Combination |
| 1 | 0 | 0 | 1 | X | X | Invalid Combination |
| 1 | 0 | 1 | 0 | X | X | Invalid Combination |
| 1 | 0 | 1 | 1 | X | X | Invalid Combination |
| 1 | 1 | 0 | 0 | 1 | 1 | Multiple Match |
| 1 | 1 | 0 | 1 | 1 | 0 | Single Match |
| 1 | 1 | 1 | 0 | X | X | Invalid Combination |
| 1 | 1 | 1 | 1 | 0 | 0 | No Match |

The sixteen entries within the truth table of TABLE 1 include seven (7) entries that represent an invalid combination of input signals. In each of these seven entries, at least one of the active low multiple match signals (NMM0 and/or NMM1) is erroneously indicated as being "true" when a corresponding any match signal (NAM0 and/or NAM1) is indicated as being "false." For example, the entry where (NAM0, NMM0, NAM1, NMM1)=0010 is an impossible combination because it shows a simultaneous no match and multiple match condition for the input pair NAM1 and NMM1. In other words, it is impossible for NMM0 to be true (i.e., NMM0=0) when NAM0 is false (i.e. NAM0=1), and it impossible for NMM1 to be true (i.e., NMM1=0) when NAM1 is false (i.e., NAM1=1). The multiple match circuit MM_ILOH of FIG. 1 generates a multiple match flag MMF that can be expressed by the following boolean expression:

$$MMF = NOT(NMM0 \times NMM1(NAM0 + NAM1)) \qquad (1)$$

Figure 2:
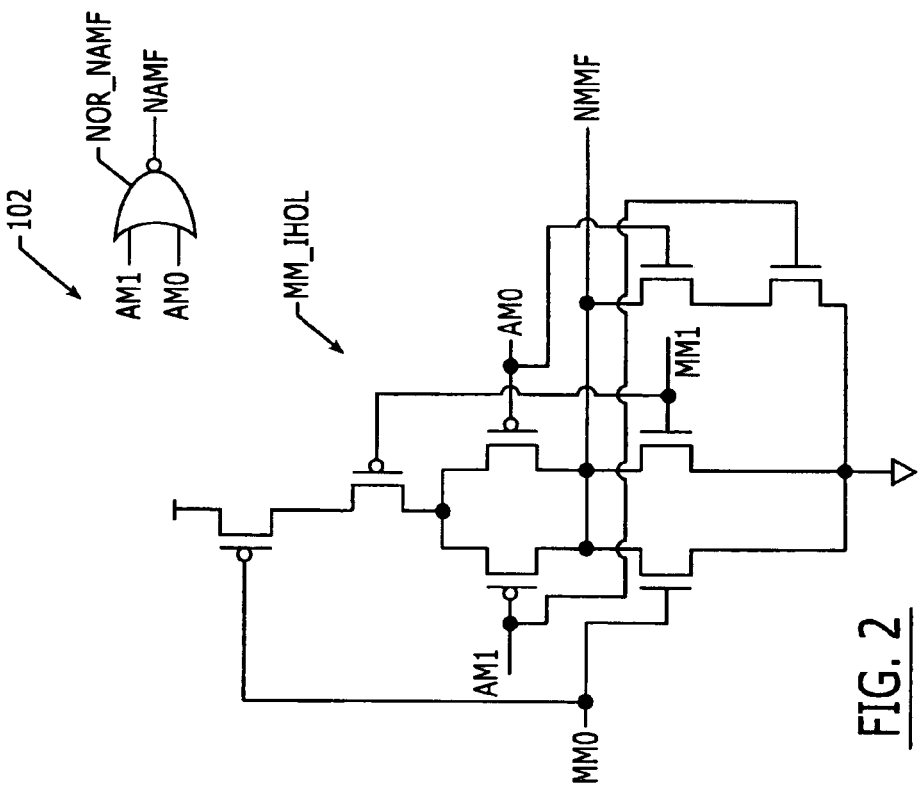

Referring now to FIG. 2, a 2-to-1 multiple match gate 102 according to a second embodiment of the present invention generates active low output signals in response to active high input signals. As illustrated, the multiple match gate 102 receives four active high input signals, which are shown as AM0 ("any match zero"), AM1 ("any match one"), MM0 ("multiple match zero") and MM1 ("multiple match one"). In response to these four active high input signals, the multiple match gate 102 generates an active low "not any match flag" (NAMF) and an active low "not multiple match flag" (NMMF). The NAMF is generated by a NOR gate, which is shown as NOR_NAMF. Thus, the NAMF will be generated as an active low signal whenever either signal AM0 or AM1 is active at a high level or both signals are active at high levels. As will be understood by those skilled in the art, the NOR gate NOR_NAMF may be defined by four transistors. In FIG. 2, the NMMF is generated by a multiple match circuit having four PMOS transistors and four NMOS transistors. The multiple match circuit is illustrated as an "input-high output-low" multiple match circuit (MM_IHOL). The four transistors within the NOR gate NOR_NAMF and the eight transistors within the multiple match circuit MM_IHOL operate in accordance with the truth table illustrated by TABLE 2.

TABLE 2

| AM0 | MM0 | AM1 | MM1 | NAMF | NMMF | DESCRIPTION |
|---|---|---|---|---|---|---|
| 0 | 0 | 0 | 0 | 1 | 1 | No Match |
| 0 | 0 | 0 | 1 | X | X | Invalid Combination |
| 0 | 0 | 1 | 0 | 0 | 1 | Single Match |
| 0 | 0 | 1 | 1 | 0 | 0 | Multiple Match |
| 0 | 1 | 0 | 0 | X | X | Invalid Combination |
| 0 | 1 | 0 | 1 | X | X | Invalid Combination |
| 0 | 1 | 1 | 0 | X | X | Invalid Combination |
| 0 | 1 | 1 | 1 | X | X | Invalid Combination |
| 1 | 0 | 0 | 0 | 0 | 1 | Single Match |
| 1 | 0 | 0 | 1 | X | X | Invalid Combination |
| 1 | 0 | 1 | 0 | 0 | 0 | Multiple Match |
| 1 | 0 | 1 | 1 | 0 | 0 | Multiple Match |
| 1 | 1 | 0 | 0 | 0 | 0 | Multiple Match |
| 1 | 1 | 0 | 1 | X | X | Invalid Combination |
| 1 | 1 | 1 | 0 | 0 | 0 | Multiple Match |
| 1 | 1 | 1 | 1 | 0 | 0 | Multiple Match |

The sixteen entries within the truth table of TABLE 2 include seven (7) entries that represent an invalid combination of input signals. In each of these seven entries, at least one of the active high multiple match signals (MM0 and/or MM1) is erroneously indicated as being "true" when a corresponding any match signal (AM0 and/or AM1) is indicated as being "false." For example, the entry where (AM0, MM0, AM1, MM1)=0001 is an impossible combination because it shows a simultaneous no match and multiple match condition for the input pair AM1 and MM1. In other words, it is impossible for MM0 to be true (i.e., MM0=1) when AM0 is false (i.e. AM0=0), and it impossible for MM1 to be true (i.e., MM1=1) when AM1 is false (i.e. AM1=0). The multiple match circuit MM_IHOL of FIG. 2 generates a not multiple match flag NMMF that can be expressed by the following boolean expression:

$$NMMF = NOT(MMF) = NOT(MM0 + MM1 + (AM0 \times AM1)) \quad (2)$$

The multiple match gates 101 and 102 of FIGS. 1 and 2 represent direct implementations of the circuitry needed to meet the boolean expressions set forth in equations (1) and (2). However, the speed of the multiple match gates 101 and 102 illustrated by FIGS. 1–2 may be limited by the presence of three NMOS transistors in the pull-down paths of the multiple match circuit MM_ILOH of FIG. 1 and the presence of three PMOS transistors in the pull-up paths of the multiple match circuit MM_IHOL of FIG. 2. In FIG. 1, the three NMOS transistors provide the worst case series resistance and speed when the multiple match flag line MMF is switched high-to-low when (NAM0, NMM0, NAM1, NMM1)=1101 or when (NAM0, NMM0, NAM1, NMM1)=0111. In FIG. 2, the three PMOS transistors provide the worst case series resistance and speed when the not multiple match flag line NMMF is switched low-to-high when (AM0, MM0, AM1, MM1)=0010 or when (AM0, MM0, AM1, MM1)=1000. These speed enhancing techniques may also be applied to other multiple match gates, including multiple match gates having a greater input to output signal ratio (e.g., 4-to-1 multiple match gates).

Figure 4:
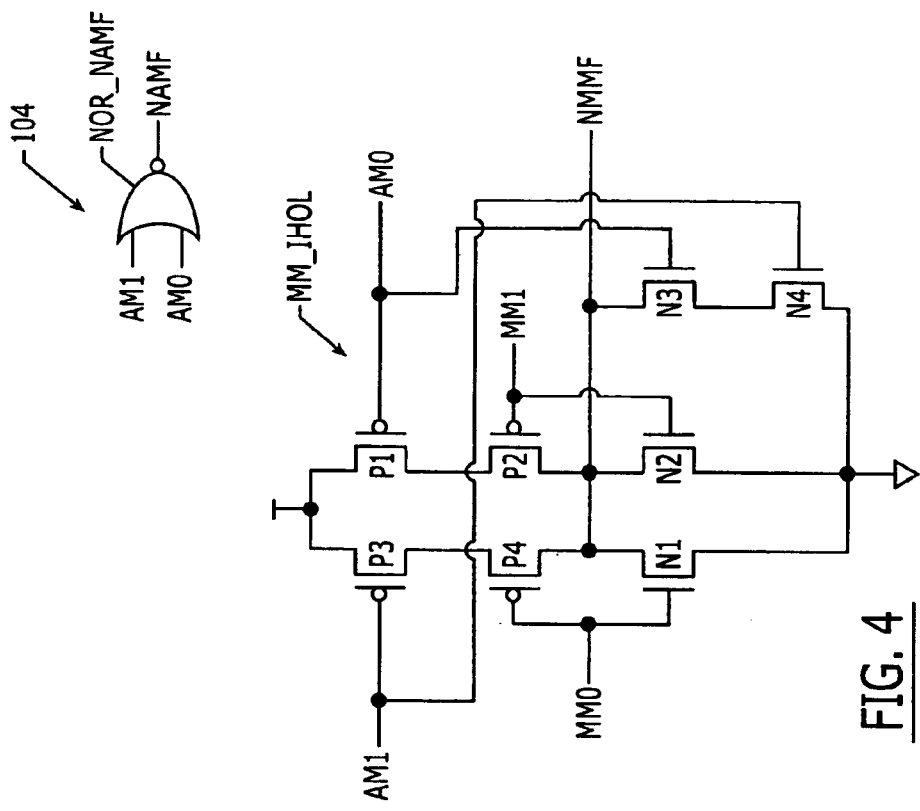

To address these speed limitations associated with the multiple match gates 101 and 102 of FIGS. 1–2, the 2-to-1 multiple match gates 103 and 104 of FIGS. 3–4 are provided as the basic building blocks of larger multiple match detection circuits having multiple stages. In particular, the multiple match gate 103 of FIG. 3 includes a multiple match circuit MM_ILOH having only two NMOS transistors in a worst case pull-down path and the multiple match gate 104 of FIG. 4 includes a multiple match circuit MM_IHOL having only two PMOS transistors in a worst case pull-up path.

With respect to FIGS. 1 and 3, the reduction in the number of NMOS transistors in the worst case pull-down path is made possible because the output of the pull-down network, MMF, will only be low (false) when either a no match or only a single match is present. This occurs when one pair of inputs reflects a no match condition and the other pair of inputs reflects a no multiple match condition. For example, a combination of NAM0=1 and NMM1=1 indicates that input pair (NAM0, NMM0) has no match and that input pair (NAM1, NMM1) has either one match or no match (i.e., no multiple match). Alternatively, a combination of NAM1=1 and NMM0=1 indicates that input pair (NAM1, NMM1) has no match and that input pair (NAM0, NMM0) has either one match or no match (i.e., no multiple match). Accordingly, the value of the multiple match flag MMF can be expressed by the following boolean expression, which also satisfies the truth table set forth at TABLE 1:

$$MMF = NOT((NMM0 \times NAM1) + (NAM0 \times NMM1)) \quad (3)$$

Thus, the multiple match circuit MM_ILOH of FIG. 3 is a boolean equivalent to the multiple match circuit MM_ILOH of FIG. 1 for valid combinations of inputs, but has better worst case speed performance.

The multiple match circuit MM_ILOH within the multiple match gate 103 of FIG. 3 may be defined as having multiple pull-down and pull-up paths. In particular, the multiple match circuit MM_ILOH includes two pull-down paths and three pull-up paths that stem from the output terminal MMF. The first pull-down path is defined by a series combination of a first NMOS transistor N1 having a gate terminal that is configured to receive the not any match signal NAM0 and a second NMOS transistor N2 having a gate terminal that is configured to receive the not multiple match signal NMM1. The second pull-down path is defined by a series combination of a third NMOS transistor N3 having a gate terminal that is configured to receive the not any match signal NAM1 and a fourth NMOS transistor N4 having a gate terminal that is configured to receive the not multiple match signal NMM0. The first pull-up path is defined by a first PMOS transistor P1 that is configured to receive the not multiple match signal NMM0, and the second pull-up path is defined by a second PMOS transistor P2 that is configured to receive the not multiple match signal NMM1. The third pull-up path is defined by a series combination of a third PMOS transistor P3 having a gate terminal that is configured to receive the not any match signal NAM0 and a fourth PMOS transistor P4 having a gate terminal that is configured to receive the not any match signal NAM1.

With respect to FIGS. 2 and 4, the reduction in the number of PMOS transistors in the worst case pull-up path is made possible because the output of the pull-up network, NMMF, will only be high (false) when either a no match or only a single match is present. This occurs when one pair of inputs reflects a no match condition and the other pair of inputs reflects a no multiple match condition. For example, a combination of AM1=0 and MM0=0 indicates that input pair (AM1, MM1) has no match and that input pair (AM0, MM0)

has either one match or no match (i.e., no multiple match). Alternatively, a combination of AM0=0 and MM1=0 indicates that input pair (AM0, MM0) has no match and that input pair (AM1, MM1) has either one match or no match (i.e., no multiple match). Accordingly, the value for the not multiple match flag NMMF can be expressed by the following boolean expression, which satisfies the truth table set forth at TABLE 2:

$$NMMF = NOT((MM0 + AM1) \times (AM0 + MM1)) \quad (4)$$

Thus, the multiple match circuit MM_IHOL of FIG. 4 is a boolean equivalent to the multiple match circuit MM_IHOL of FIG. 2 for valid combinations of inputs, but has better worst case speed performance.

The multiple match circuit MM_IHOL within the multiple match gate 104 of FIG. 4 may be defined as having multiple pull-down and pull-up paths. In particular, the multiple match circuit MM_IHOL includes two pull-up paths and three pull-down paths that stem from the output terminal NMMF. The first pull-up path is defined by a series combination of a first PMOS transistor P1 having a gate terminal that is configured to receive the any match signal AM0 and a second PMOS transistor P2 having a gate terminal that is configured to receive the multiple match signal MM1. The second pull-up path is defined by a series combination of a third PMOS transistor P3 having a gate terminal that is configured to receive the any match signal AM1 and a fourth PMOS transistor P4 having a gate terminal that is configured to receive the multiple match signal MM0. The first pull-down path is defined by a first NMOS transistor N1 that is configured to receive the multiple match signal MM0, and the second pull-down path is defined by a second NMOS transistor N2 that is configured to receive the multiple match signal MM1. The third pull-down path is defined by a series combination of a third NMOS transistor N3 having a gate terminal that is configured to receive the any match signal AM0 and a fourth NMOS transistor N4 having a gate terminal that is configured to receive the any match signal AM1.

Figure 7:
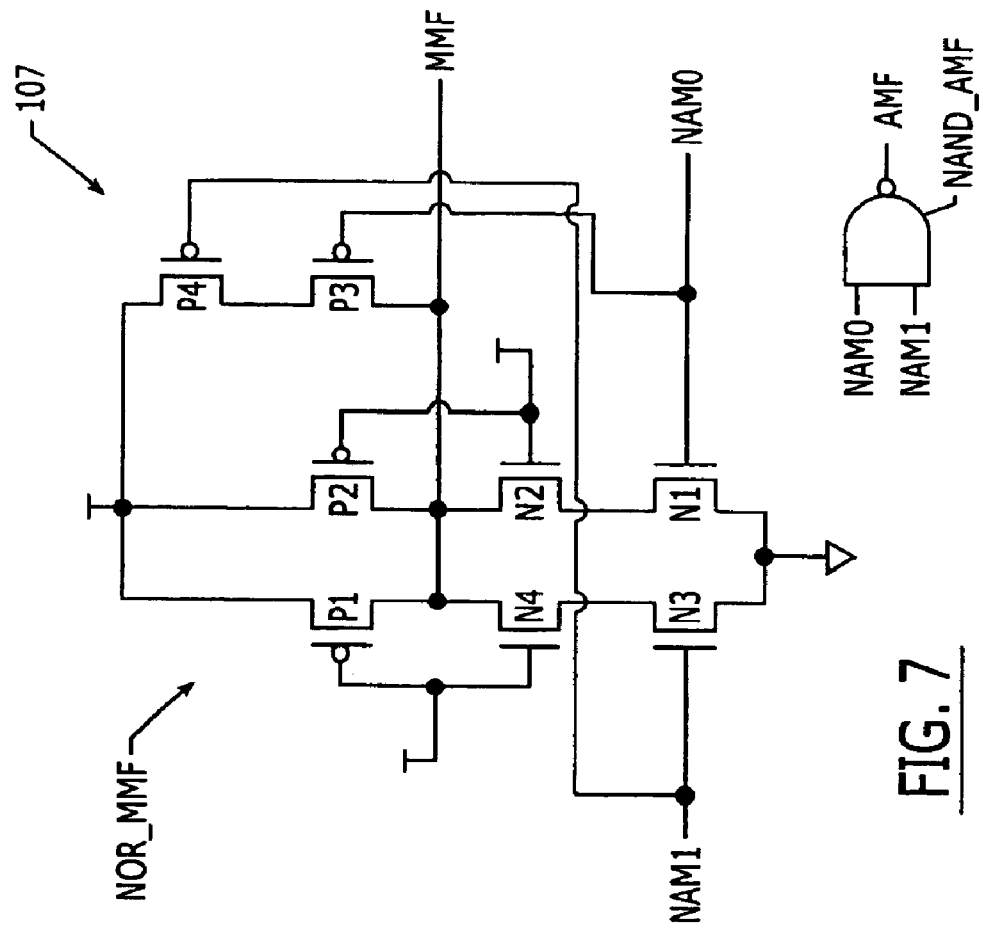
FIGS. 5–8 are electrical schematics of 2- to 1 multiple match gates that may be used within a first stage of a multiple match detection circuit according to an embodiment of the present invention.
Figure 5:
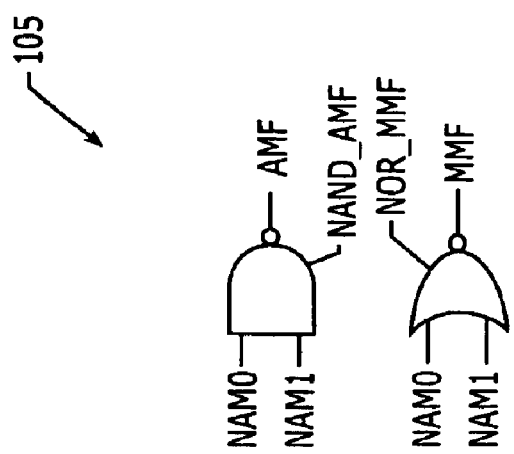

As illustrated by the multiple match gates 105 and 107 of FIGS. 5 and 7, the multiple match gate 103 of FIG. 3 can be further simplified when it is used in a first stage of a multiple match detection circuit that is configured to receive not any match signals (NAM0, NAM1, . . . ). This is typically the case when the first stage of the multiple match detection circuit is configured to receive active low match signals from a CAM array (or multiple CAM array devices). In this case, the not multiple match signal lines NMM0 and NMM1 may not exist as inputs. As illustrated by the multiple match gate 107 of FIG. 7, these multiple match signal lines NMM0 and NMM1 may be treated as being permanently false (i.e., NMM0=NMM1=1), which means that the two NMOS transistors N2 and N4 can be replaced by electrical shorts and the two PMOS transistors that receive NMM0 and NMM1 can be replaced by electrical opens. In this manner, the multiple match gate 107 of FIG. 7 may be simplified as shown by the multiple match gate 105 of FIG. 5, which includes one two-input NAND gate NAND_AMF and one two-input NOR gate NOR_MMF.

Figure 8:
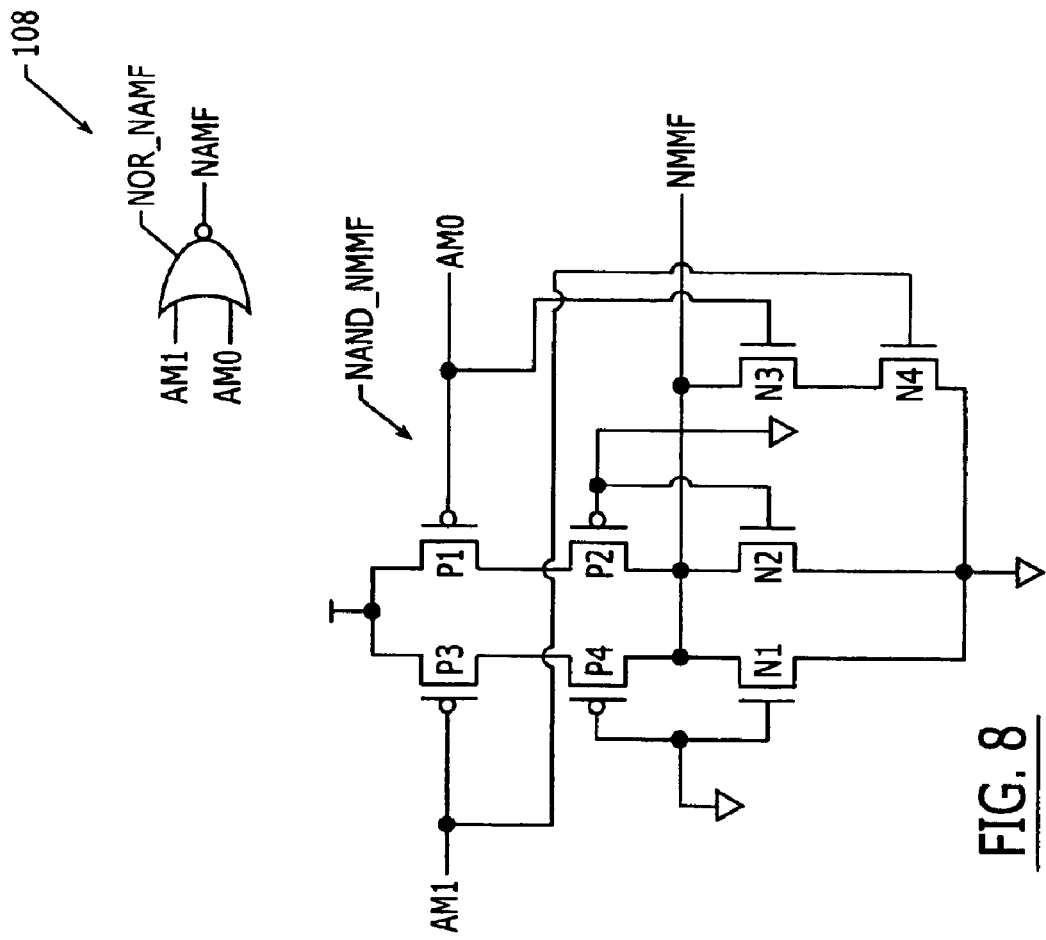
Figure 6:
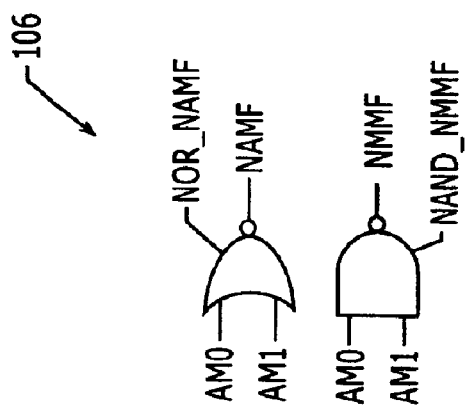

Likewise, the multiple match gates 106 and 108 of FIGS. 6 and 8 illustrate how the multiple match gate 104 of FIG. 4 can be further simplified when it is used in a first stage of a multiple match detection circuit that is configured to receive only any match signals (AM0, AM1, . . . ). This is typically the case when the first stage of the multiple match detection circuit is configured to receive only active high any match signals from a CAM array (or multiple CAM array devices) and the multiple match signal lines MM0 and MM1 do not exist as inputs. As illustrated by the multiple match gate 108 of FIG. 8, the multiple match signal lines MM0 and MM1 may be treated as being permanently false (i.e., MM0=MM1=0). This means that the two NMOS transistors N1 and N2 can be replaced by electrical opens and the two PMOS transistors P2 and P4 can be replaced by electrical shorts. In this manner, the multiple match gate 108 of FIG. 8 may be simplified as shown by the multiple match gate 106 of FIG. 6, which includes one two-input NAND gate NAND_NMMF and one two-input NOR gate NOR_NAMF.

Figure 11:
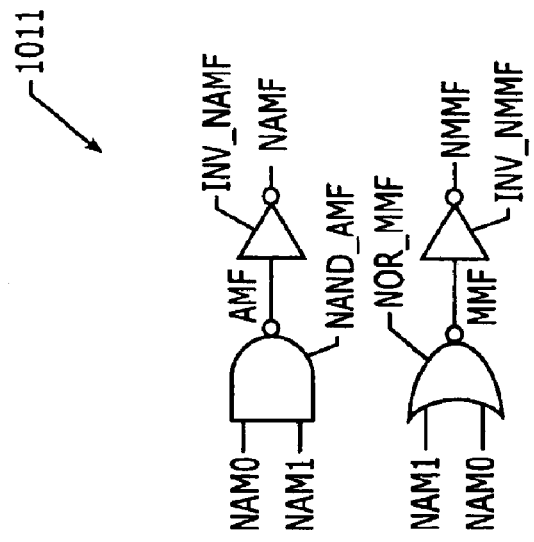
FIG. 11 is an electrical schematic of a 2-to-1 multiple match gate that is similar to the multiple match gate of FIG. 5, but includes output inverters.
Figure 9:
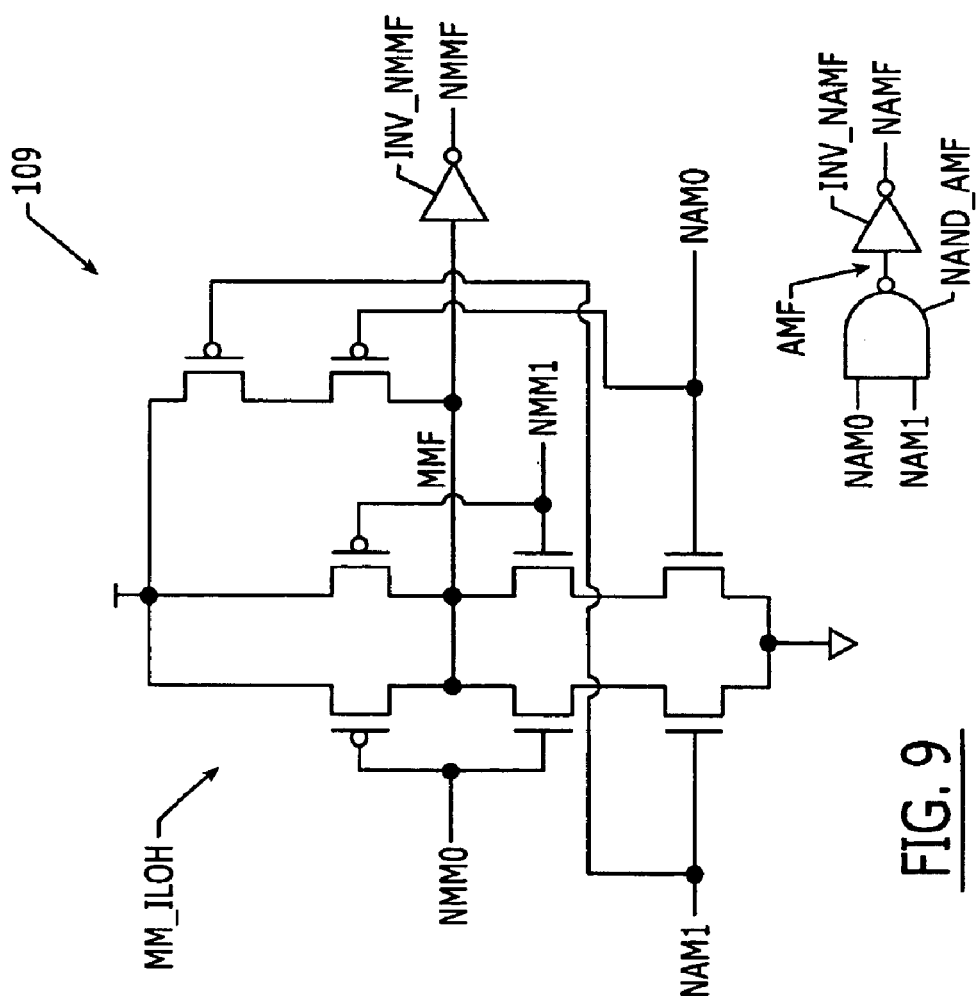
FIG. 9 is an electrical schematic of a 2-to-1 multiple match gate that is similar to the multiple match gate of FIG. 3, but includes output inverters.
Figure 12:
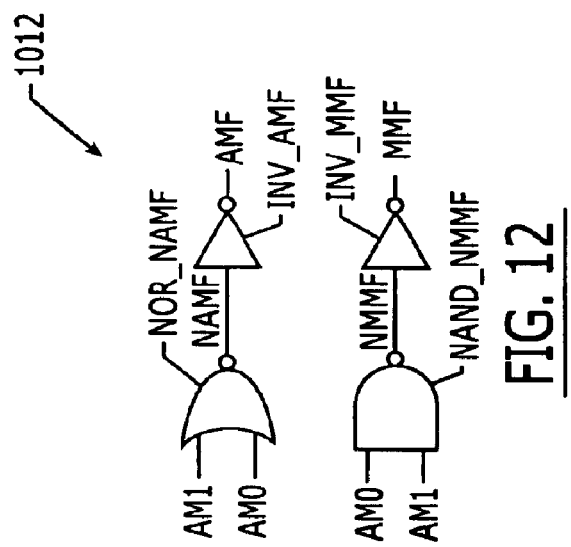
FIG. 12 is an electrical schematic of a 2-to-1 multiple match gate that is similar to the multiple match gate of FIG. 6, but includes output inverters.
Figure 10:
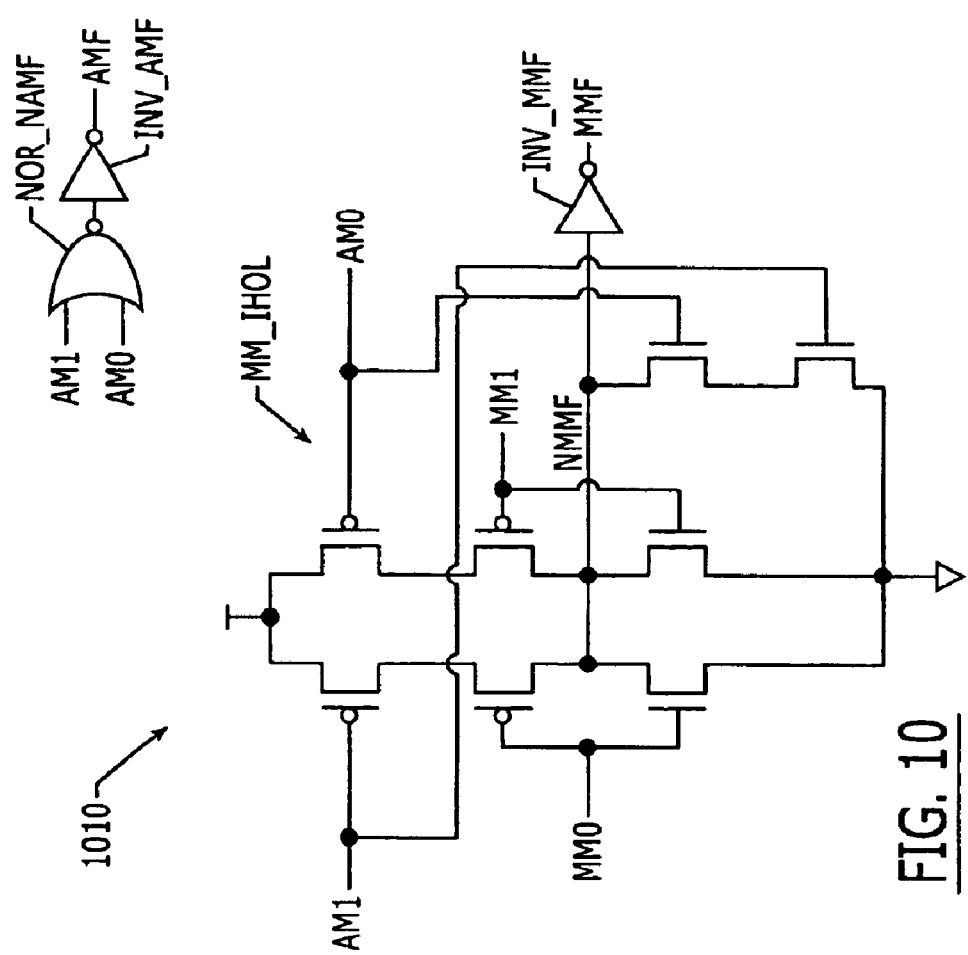
FIG. 10 is an electrical schematic of a 2-to-1 multiple match gate that is similar to the multiple match gate of FIG. 4, but includes output inverters.

Referring now to FIG. 9, the multiple match gate 109 is shown as being similar to the multiple match gate 103 of FIG. 3; however, a pair of inverters INV_NMMF and INV_NAMF have been added to make the number of inversions from input to output even. Each inverter adds two transistors. Thus, the multiple match gate 109 of FIG. 9 is defined by sixteen (16) transistors. Similarly, the multiple match gate 1011 of FIG. 11 is similar to the multiple match gate 105 of FIG. 5, however, a pair of inverters INV_NMMF and INV_NAMF have been added to make the number of inversions from input to output even. In FIG. 10, the multiple match gate 1010 is shown as being similar to the multiple match gate 104 of FIG. 4, however, a pair of inverters INV_MMF and INV_AMF have been added to make the number of inversions from input to output even. The multiple match gate 1012 of FIG. 12 is similar to the multiple match gate 106 of FIG. 6, however, a pair of inverters INV_MMF and INV_AMF have been added to make the number of inversions from input to output even.

The above-described 2-to-1 multiple match gates may be used as building blocks to construct multi-stage multiple match detection circuits that are hierarchically cascadable. In particular, the multiple match detection circuits 1013–1017 of FIGS. 13–17 are configured to generate a final multiple match flag (MMF) and a final any match flag (AMF) in response to input match signals that see relatively small fanout. These multiple match detection circuits include $\log_2 N$ stages of 2-to-1 multiple match gates, where $N=2^k$ and k is a positive integer. The final MMF is set to an active level whenever at least two of the input match signals indicate a match condition and the AMF is set to an active level whenever at least one of the input match signals indicates a match condition.

Figure 13:
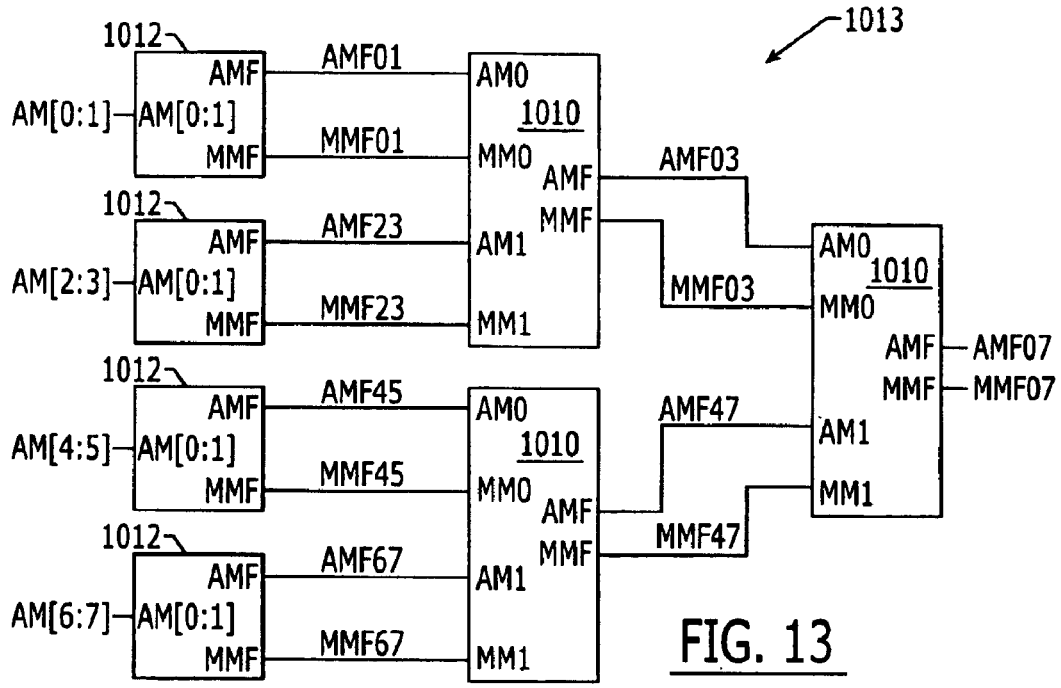
FIGS. 13–17 are block diagrams of multiple match detection circuits according to embodiments of the present invention.

In FIG. 13, the multiple match detection circuit 1013 is configured to generate a final any match flag AMF07 and a final multiple match flag MMF07 in response to eight (8) match signals [AM0:AM7], which are received at a first stage of the multiple match detection circuit 1013. This first stage of the multiple match detection circuit 1013 includes four multiple match gates, which are configured in accordance with the multiple match gate 1012 of FIG. 12. The intermediate stage of the multiple match detection circuit 1013 includes two multiple match gates, which are configured in accordance with the multiple match gate 1010 of FIG. 10. These two multiple match gates receive the any match and multiple match flags AMF01–AMF67 and MMF01–MMF67. The final stage of the multiple match detection circuit 1013 includes a single multiple match gate 1010, which receives a pair of any match flags AMF03 and AMF47 and a pair of multiple match flags MMF03 and MMF47. Thus, with just three stages, the multiple match detection circuit 1013 of FIG. 13 can process eight match signals. These match signals may be generated by respective rows of a CAM array block, by respective CAM array blocks within a CAM device or by respective CAM devices within a multi-chip system, for example.

Figure 14:
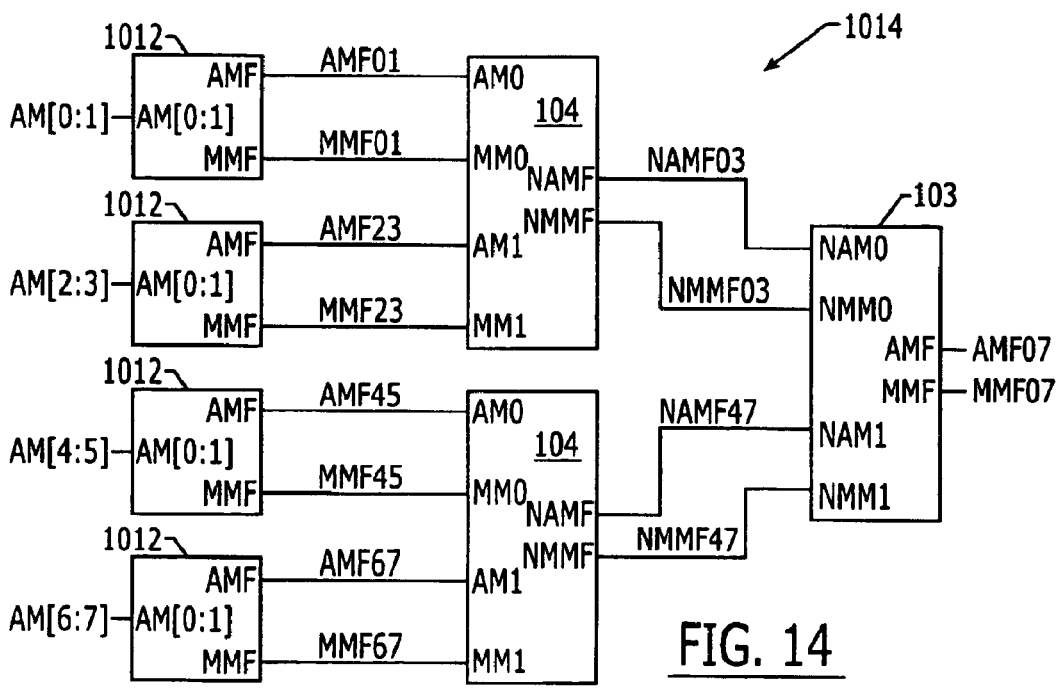
Figure 15:
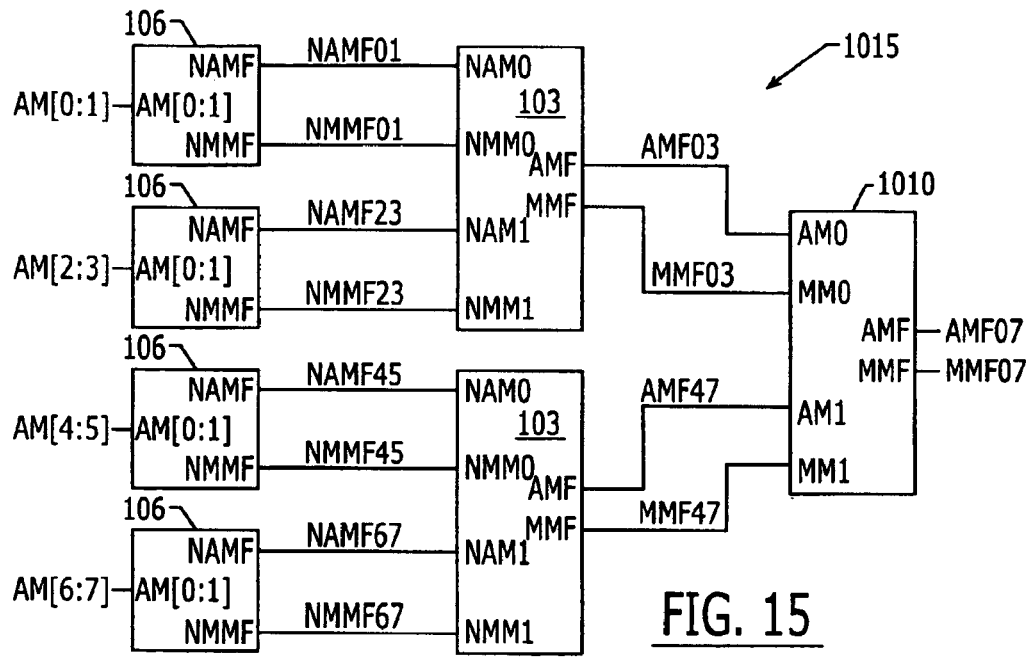

The multiple match detection circuit 1014 of FIG. 14 is similar to the multiple match detection circuit 1013 of FIG. 13, however, the multiple match gates 104 and 103 are used to construct the two intermediate stages and the final stage, respectively. As illustrated, the multiple match gates 104 in the intermediate stage generate not any match flags NAMF03 and NAMF47 and not multiple match flags NMMF03 and NMMF47. In FIG. 15, a three stage multiple match detection circuit 1015 is illustrated as including six multiple match gates 106, which define a first stage, two multiple match gates 103, which define an intermediate stage, and a multiple match gate 1010, which defines a final stage. The multiple match gates 106 generate the not any match flags NAMF01, NAMF23, NAMF45 and NAMF67 and the not multiple match flags NMMF01, NMMF23, NMMF45 and NMMF67. The two multiple match gates 103 generate the any match flags AMF03 and AMF47 and the multiple match flags MMF03 and MMF47.

Figure 16:
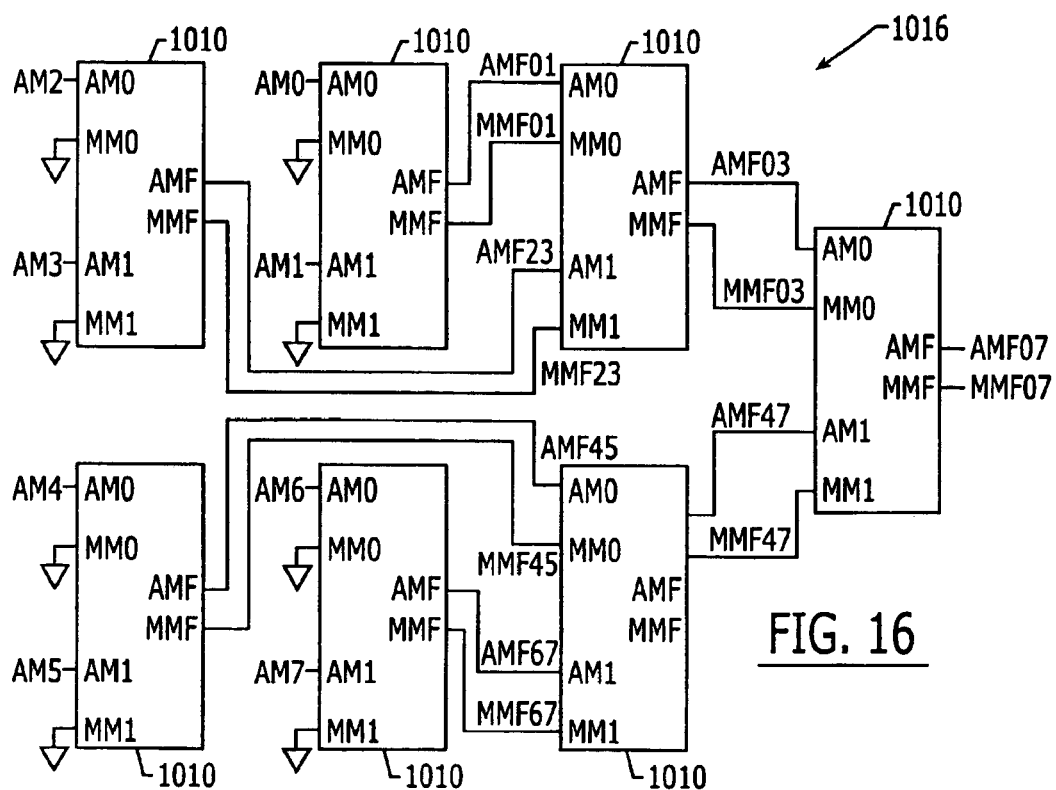

In FIG. 16, a multiple match detection circuit 1016, which includes seven equivalent multiple match gates 1010, is illustrated. The four multiple match gates 1010 associated with the first stage include multiple match inputs MM0 and MM1 that are tied to ground, to thereby represent false conditions. The two multiple match gates 1010 associated with the intermediate stage generate the any match flags AMF03 and AMF47 and the multiple match flags MMF03 and MMF47. The multiple match gate 1010 associated with the final stage generates the final any match flag AMF07 and the final multiple match flag MMF07.

Figure 17:
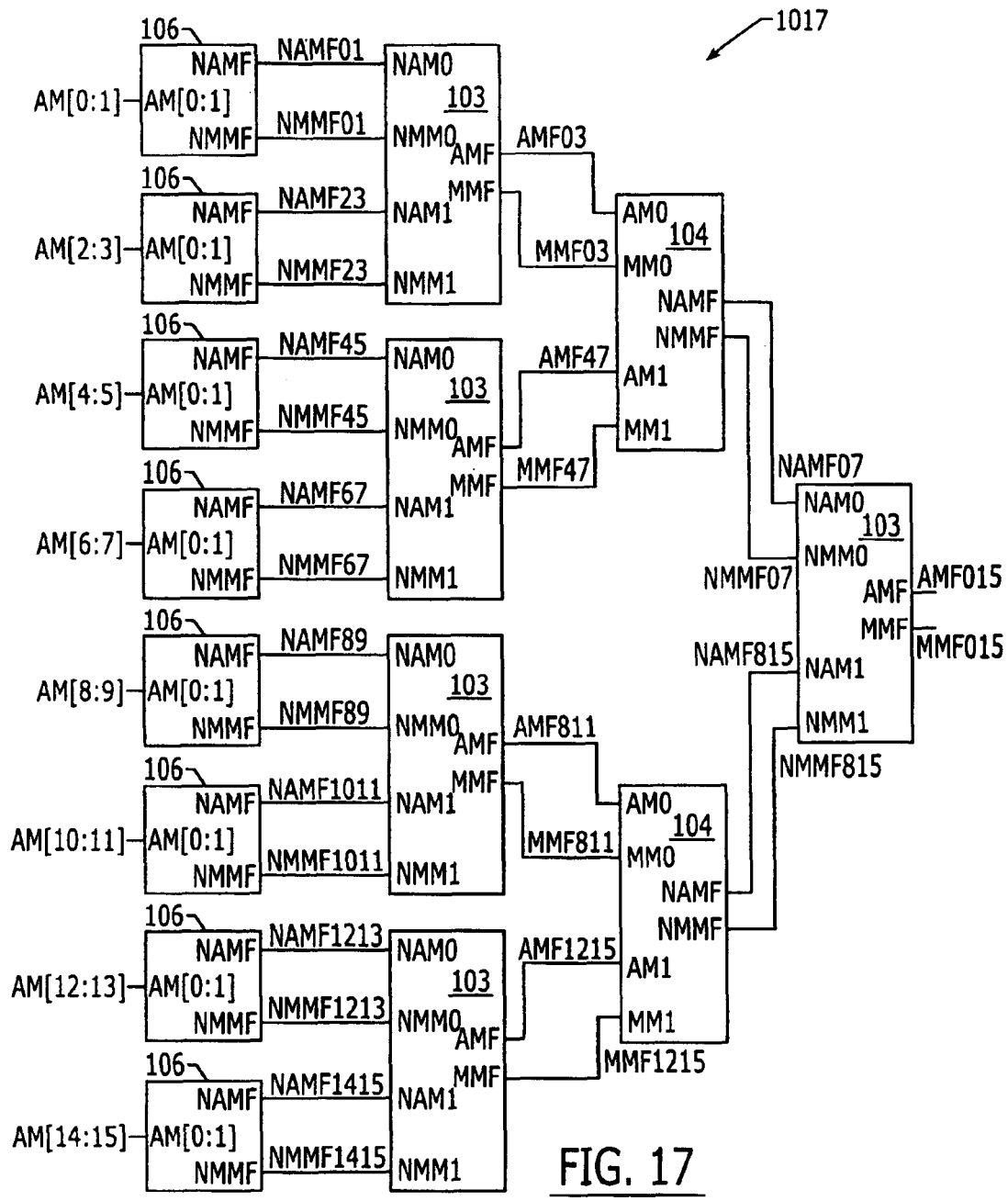

FIG. 17 illustrates a four-stage multiple match detection circuit 1017 that is configured to process sixteen (16) match signals, which are shown as AM[0:151]. The first stage of the multiple match detection circuit 1017 includes eight input-high output-low (IHOL) multiple match gates 106 and the second stage includes four input-low output-high (ILOH) multiple match gates 103. The third stage of the multiple match detection circuit 1017 includes two input-high output-low (IHOL) multiple match gates 104 and the fourth and final stage includes another copy of the input-low output-high; (ILOH) multiple match gate 103. Thus, the multiple match detection circuit 1017 of FIG. 17 includes a plurality of stages of multiple match gates (e.g., second, third and fourth stages) that are each configured to generate a respective pair of any match and multiple match flags. Moreover, the plurality of stages include at least two stages that are arranged in an alternating input-high output-low (IHOL) and input-low output-high (ILOH) sequence.

The total number of transistors in the multiple match detection circuit 1017 can be expressed as follows:

148=(8 transistors/gate)(8 first stage gates 106)+(12 transistors/gate)(4 second stage gates 103)+(12 transistors/gate)(2 third stage gates 104)+(12 transistors/gate)(1 final stage gate 103)= ((½N×8)+((½N−1)×12)), where N=16.

Accordingly, a multiple match detection circuit according to an embodiment of the present invention may include a total of N−1 multiple match gates that are arranged in a cascaded fashion, with a first stage having ½N gates therein, a final stage having one gate therein and a plurality of intermediate stages having a total of ½N−2 gates therein, where N equals the number of match signals received by the circuit, and N=$2^k$, where k is a positive integer. The multiple match gates in the final and intermediate stages may be configured with only twelve (12) transistors per gate and the multiple match gates in the first stage may be configured with only eight (8) transistors per gate. Moreover, as illustrated by FIGS. 5–6, a multiple match detection-circuit can be configured so that each of the N match signals sees a relatively small fanout to the gate terminals of only four MOS transistors.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A multiple match gate, comprising:
a first pull-down path defined by a first NMOS transistor having a gate terminal that is configured to receive a not any match signal NAM0 and a second NMOS transistor having a gate terminal that is configured to receive a not multiple match signal NMM1;
a second pull-down path defined by third NMOS transistor having a gate terminal that is configured to receive a not any match signal NAM1 and a fourth NMOS transistor having a gate terminal that is configured to receive a not multiple match signal NMM0;
a first pull-up path defined by a first PMOS transistor having a gate terminal that is configured to receive the not multiple match signal NMM0;
a second pull-up path defined by a second PMOS transistor having a gate terminal that is configured to receive the not multiple match signal NMM1;
a third pull-up path defined by a third PMOS transistor having a gate terminal that is configured to receive the not any match signal NAM0 and a fourth PMOS transistor having a gate terminal that is configured to receive the not any match signal NAM1; and
a multiple match flag (MMF) terminal that is electrically connected to said first and second pull-down paths and said first, second and third pull-up paths so that the following boolean expression is satisfied:

$$MMF=NOT((NMM0 \times NAM1)+(NAM0 \times NMM1)).$$

2. The multiple match gate of claim 1, further comprising:
a NAND gate that is configured to generate an any match flag (AMF) in response to the not any match signals NAM0 and NAM1.

3. A multiple match gate, comprising:
a first pull-up path defined by a first PMOS transistor having a gate terminal that is configured to receive an any match signal AM0 and a second PMOS transistor having a gate terminal that is configured to receive a multiple match signal MM1;
a second pull-up path defined by third PMOS transistor having a gate terminal that is configured to receive an any match signal AM1 and a fourth PMOS transistor having a gate terminal that is configured to receive a multiple match signal MM0;
a first pull-down path defined by a first NMOS transistor having a gate terminal that is configured to receive the multiple match signal MM0;
a second pull-down path defined by a second NMOS transistor having a gate terminal that is configured to receive the multiple match signal MM1;
a third pull-down path defined by a third NMOS transistor having a gate terminal that is configured to receive the any match signal AM0 and a fourth NMOS transistor having a gate terminal that is configured to receive the any match signal AM1; and a not multiple match flag (NMMF) terminal that is electrically connected to said first and second pull-up paths and said first, second and third pull-down paths so that the following boolean expression is satisfied:

$$NMMF = NOT((MM0+AM1) \times (AM0+MM1)).$$

4. The multiple match gate of claim 3, further comprising:
a NOR gate that is configured to generate a not any match flag (AMF) in response to the any match signals AM0 and AM1.

* * * * *

UNITED STATES PATENT AND TRADEMARK OFFICE
CERTIFICATE OF CORRECTION

| | | |
|---|---|---|
| PATENT NO. | : 6,859,378 B1 | Page 1 of 1 |
| DATED | : February 22, 2005 | |
| INVENTOR(S) | : James K. Lin and Chau-Chin Wu | |

It is certified that error appears in the above-identified patent and that said Letters Patent is hereby corrected as shown below:

<u>Title page,</u>
Item [62], Related U.S. Application Data, should read:
-- Division of application No. 10/385,155, filed on Mar. 10, 2003, now U.S. Patent No. 6,924,994 --.

Signed and Sealed this

Eighth Day of November, 2005

JON W. DUDAS
*Director of the United States Patent and Trademark Office*